(12) United States Patent
Hasegawa et al.

(10) Patent No.: US 8,314,346 B2
(45) Date of Patent: Nov. 20, 2012

(54) WIRING BOARD FOR LIGHT-EMITTING ELEMENT

(75) Inventors: Tomohide Hasegawa, Kokubu (JP); Minako Izumi, Kokubu (JP); Yasuhiro Sasaki, Kokubu (JP); Noriaki Hamada, Kokubu (JP); Takuji Okamura, Setsumasendai (JP); Koichi Motomura, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/071,431

(22) Filed: Mar. 24, 2011

(65) Prior Publication Data
US 2011/0169037 A1 Jul. 14, 2011

Related U.S. Application Data

(62) Division of application No. 11/568,258, filed as application No. PCT/JP2005/006727 on Mar. 30, 2005, now abandoned.

(30) Foreign Application Priority Data

| Apr. 27, 2004 | (JP) | 2004-130901 |
| Jul. 28, 2004 | (JP) | 2004-219779 |
| Aug. 23, 2004 | (JP) | 2004-242224 |
| Aug. 26, 2004 | (JP) | 2004-247203 |
| Sep. 27, 2004 | (JP) | 2004-279513 |
| Nov. 24, 2004 | (JP) | 2004-338867 |
| Nov. 25, 2004 | (JP) | 2004-340339 |

(51) Int. Cl.
*H05K 1/16* (2006.01)

(52) U.S. Cl. .......... 174/260; 174/252; 362/800

(58) Field of Classification Search .................. None
See application file for complete search history.

(56) References Cited

U.S. PATENT DOCUMENTS

| 5,285,352 | A | 2/1994 | Pastore et al. ............ 361/707 |
| 5,386,339 | A | 1/1995 | Polinski, Sr. ............ 361/719 |
| 5,731,067 | A | 3/1998 | Asai et al. ............ 428/210 |
| 6,121,637 | A | 9/2000 | Isokawa et al. ............ 257/99 |
| 6,156,980 | A | 12/2000 | Peugh et al. ............ 174/252 |
| 6,329,065 | B1 | 12/2001 | Ishida et al. |
| 6,670,751 | B2 | 12/2003 | Song et al. ............ 313/512 |
| 7,095,053 | B2 | 8/2006 | Mazzochette et al. ....... 257/81 |
| 7,321,098 | B2 | 1/2008 | Sarma et al. ............ 174/260 |
| 7,854,535 | B2* | 12/2010 | Weng et al. ............ 362/296.07 |
| 2003/0189830 | A1* | 10/2003 | Sugimoto et al. ............ 362/294 |
| 2004/0012958 | A1 | 1/2004 | Hashimoto et al. |

FOREIGN PATENT DOCUMENTS

| JP | 63-197369 | 12/1988 |
| JP | 03-120791 | 5/1991 |
| JP | 03-272197 | 12/1991 |
| JP | 06-237081 | 8/1994 |
| JP | 09-153679 | 6/1997 |

(Continued)

*Primary Examiner* — Ishwarbhai Patel
(74) *Attorney, Agent, or Firm* — DLA Piper LLP (US)

(57) ABSTRACT

A wiring board for a light-emitting element includes a ceramic insulating substrate, and a conductor layer formed on the surface or in the inside of the insulating substrate, the conductor layer having a mounting region mounting a light-emitting element on one surface of the insulating substrate. The insulating substrate includes a heat-conducting pole-like conductor having a thermal conductivity higher than that of the insulating substrate. The heat-conducting pole-like conductor extends through the insulating substrate in the direction of thickness thereof from the light-emitting element mounting region of the insulating substrate, and is formed by the co-firing with the insulating substrate.

8 Claims, 8 Drawing Sheets

(a)

(b)

FOREIGN PATENT DOCUMENTS

| | | |
|---|---|---|
| JP | 11-103141 | 4/1999 |
| JP | 2001-007403 | 1/2001 |
| JP | 2001-185838 | 7/2001 |
| JP | 2001-203393 | 7/2001 |
| JP | 2002-198660 | 7/2002 |
| JP | 2003-209286 | 7/2003 |
| JP | 2003-243718 | 8/2003 |
| JP | 2003-258160 | 9/2003 |
| JP | 2004-083325 | 3/2004 |
| JP | 2004-111937 | 4/2004 |
| JP | 2005-035864 | 2/2005 |

* cited by examiner (a)

(b)

(a)

(b)

(a)

(b)

(c)

(a)

(b)

WIRING BOARD FOR LIGHT-EMITTING ELEMENT

CROSS-REFERENCE TO THE RELATED APPLICATIONS

This application is a divisional of application Ser. No. 11/568,258, filed on Aug. 10, 2007, which is a national stage of international application No. PCT/JP2005/006727, filed on Mar. 30, 2005, and claims the benefit of priority under 35 USC 119 to Japanese Patent Application Nos. 2004-130901, filed on Apr. 27, 2004, 2004-219779, filed on Jul. 28, 2004, 2004-242224, filed on Aug. 23, 2004, 2004-247203, filed on Aug. 26, 2004, 2004-279513, filed on Sept. 27, 2004, 2004-338867, filed on Nov. 24, 2004 and 2004-340339, filed on Nov. 25, 2004, the entire contents of all of which are incorporated herein by reference.

TECHNICAL FIELD

The present invention relates to a wiring board for mounting a light-emitting element such as a light-emitting diode (LED).

BACKGROUND ART

So far, a light-emitting device obtained by mounting an LED on a wiring board features a very high light-emitting efficiency, emits light producing heat in amounts smaller than that of incandescent lamps, and has been used for a variety of applications. However, the light-emitting device of this kind emits light in amounts smaller than those of incandescent bulbs and fluorescent lamps, and is used not for illumination purposes but as a source of light of an indicator consuming a current which is as very small as about 30 mA. The light-emitting device of this kind consumes a small electric power generating a small amount of heat, and has, hence, been realized chiefly in a structure of a so-called bullet type by burying the light-emitting element (LED) in a plastic insulating substrate (see patent document 1).

Accompanying the development of a light-emitting element featuring a high brightness and white light in recent years, further, the light-emitting device has been much used as a back light for cell phones and large liquid crystal TVs. However, an increase in the brightness of the light-emitting element is accompanied by an increase in the heat generated by the light-emitting device. To prevent a decrease in the brightness of the light-emitting element, therefore, it is becoming necessary to provide a wiring board for light-emitting element capable of quickly and highly radiating the heat produced by the light-emitting element (see patent documents 2 and 3).

Patent document 1: JP-A-2002-124790
Patent document 2: JP-A-11-112025
Patent document 3: JP-A-2003-347600

DISCLOSURE OF THE INVENTION

The wiring board used for a light-emitting element includes a conductor layer on the surface or in the inside of a flat insulating substrate, and has such a structure that the light-emitting element is mounted on one surface of the insulating substrate. The insulating substrate used for the wiring board is in many cases made of alumina. The insulating board made of alumina has a coefficient of thermal expansion of about $7.0 \times 10^{-6}/°$ C., and a difference in the coefficient of thermal expansion from the printed board does not cause any practical problem. Therefore, excellent connection reliability is obtained between the two. However, the alumina has a thermal conductivity of as low as about 15 W/m·K. To substitute for the alumina, therefore, attention has now been given to the aluminum nitride having a high thermal conductivity. However, the aluminum nitride is accompanied by such defects that the starting material thereof is expensive, that the firing must be effected at a high temperature since it can be sintered difficultly and that the process cost is high. Besides, due to its coefficient of thermal expansion which is as small as 4 to $5 \times 10^{-6}/°$ C., the wiring board using the aluminum nitride insulating substrate arouses a problem of deteriorating the connection reliability when it is mounted on a general-purpose printed board (having a coefficient of thermal expansion of not smaller than $10 \times 10^{-6}/°$ C.) due to a difference in the thermal expansion.

On the other hand, an insulating substrate made of a resin has a coefficient of thermal expansion close to that of the printed board and poses no problem concerning the reliability of mounting the printed board, but has a thermal conductivity which is as very low as 0.05 W/m·K, and is not quite capable of coping with the problem related to the heat. When used in the near ultraviolet-ray band for extended periods of time, therefore, the insulating board is blackened causing a decrease in the brightness of the light-emitting element.

Thus, there has not yet been provided a wiring board for light-emitting element, which is inexpensive exhibiting excellent thermal conductivity and excellent mounting reliability.

It is, therefore, an object of the present invention to provide a wiring board for light-emitting element, which is inexpensive featuring excellent heat-radiating performance and reliable mounting.

Another object of the present invention is to provide a light-emitting device mounting a light-emitting element on the wiring board.

According to the present invention, there is provided a wiring board for light-emitting element, comprising a ceramic insulating substrate, and a conductor layer formed on the surface or in the inside of the insulating substrate, and having a mounting region mounting a light-emitting element on one surface of the insulating substrate; wherein the insulating substrate is provided with a heat-conducting pole-like conductor having a thermal conductivity higher than that of the insulating substrate; and the heat-conducting pole-like conductor is extending through the insulating substrate in the direction of thickness thereof from the light-emitting element mounting region of the insulating substrate, and is formed by co-firing with the insulating substrate.

In the wiring board for light-emitting element of the present invention, the heat-conducting pole-like conductor having a thermal conductivity higher than that of the insulating substrate is extending through the insulating substrate enabling the heat generated by the light-emitting element to be quickly radiated out of the wiring board. Therefore, the light-emitting element is effectively suppressed from being excessively heated preventing a decrease in the brightness of the light-emitting element or enhancing the brightness of the light-emitting element.

Besides, the insulating substrate made of ceramics has a higher thermal conductivity than that of a substrate made by molding a resin, and features excellent heat-radiating performance without exhibiting a change in the molecular structure that is caused by the heat generated from the source of light or by the light emitted from the source of light even after the passage of an extended period of time, without almost causing a change in the color tone (blackening, etc.) or deterioration in the characteristics, and maintaining high reliability.

In the present invention, the insulating substrate can be formed by firing at any temperature. Here, use of a high temperature-firing insulating substrate having a firing temperature of higher than 1050° C. is advantageous from the standpoint of enhancing the thermal conductivity while use of a low temperature-firing insulating substrate having a firing temperature of not higher than 1050° C. is advantageous from such a standpoint that the wiring layer of a low-resistance conductor such as of gold, silver or copper can be formed by the co-firing.

It is desired that the surface of the insulating substrate on the side of the light-emitting element mounting region has a total reflection factor of not lower than 70% to prevent light of the light-emitting element from transmitting through the insulating substrate or from being absorbed by the insulating substrate, and to enhance the light-emitting efficiency.

The heat-conducting pole-like conductor is extending through the insulating substrate from the region on where the light-emitting element is mounted to quickly radiate the heat generated by the light-emitting element. It is desired that the heat-conducting pole-like conductor has a plane sectional area greater than the mounting area (corresponds to the bottom surface of the light-emitting element) on where the light-emitting element is mounted. This increases the heat-radiating portion enabling the heat generated by the light-emitting element to be more quickly radiated.

It is further desired that the boundary portion between the end surface of the heat-conducting pole-like conductor and the surface of the insulating substrate, and the vicinity thereof, are covered with a boundary protection layer formed by at least one of those selected from the group consisting of a metal, ceramics and a resin. Provision of the boundary protection layer works to relax the difference in the thermal expansion between the pole-like conductor and the insulating substrate and to suppress the occurrence of cracks on the boundary.

It is further desired that the end surface of the heat-conducting pole-like conductor on the side of the mounting region (end surface of the upper side) and the peripheral edges thereof are covered with a covering layer containing a metal or a resin and that the end surface of the heat-conducting pole-like conductor on the side opposite to the side of the mounting region (end surface of the lower side) and the peripheral edges thereof are covered with a covering layer containing at least one of those selected from the group consisting of a metal, ceramics and a resin. Provision of the covering layer on the end surface on the upper side of the heat-conducting pole-like conductor or on the end surface on the lower side thereof, too, makes it possible to relax the difference in the thermal expansion between the pole-like conductor and the insulating substrate and to suppress the occurrence of cracks on the boundary between the end surface of the pole-like conductor and the insulating substrate.

It is further desired that the heat-conducting pole-like conductor has a thermal conductivity of not smaller than 80 W/m·K from the standpoint of quickly radiating the heat generated by the light-emitting element.

Further, it is desired that the heat-conducting pole-like conductor is formed by using a metal material and a ceramic material. Use of the metal/ceramic pole-like conductor makes it easy to control, for example, the coefficient of thermal expansion. Upon bringing the coefficient of thermal expansion close to that of the insulating substrate, it is made possible to suppress the occurrence of cracks caused by the mismatching in the thermal expansion from the from that of the insulating substrate. It is further allowed to increase the adhering strength between the pole-like conductor and the insulating substrate, which is advantageous even from the standpoint of conducting the co-firing with the insulating substrate.

In the present invention, the heat-conducting pole-like conductor can be incorporated in a portion of the electric circuit. In this case, no conduction terminal is necessary offering advantage from the standpoint of decreasing the size of the wiring board for light-emitting element.

The heat-conducting pole-like conductor may be formed by using a plurality of layers having different coefficients of thermal expansion or different thermal conductivities. When the heat-conducting pole-like conductor is formed relying upon the above laminated-layer structure, the coefficients of thermal expansion and the thermal conductivities of the layers are varied, e.g., a difference in the thermal expansion is decreased between the layer on the side of the mounting region and the light-emitting element that is mounted. In this case, the layer of the lower side is set to possess a high thermal conductivity irrespective of the coefficient of thermal expansion to enhance the heat-radiating performance yet maintaining reliability.

In the light-emitting device mounting the light-emitting element on the wiring board for light-emitting element of the present invention as described above, heat generated by the light-emitting element can be quickly radiated out of the device, suppressing a decrease in the brightness caused by heat generated by the light-emitting element.

BEST MODE FOR CARRYING OUT THE INVENTION

Wiring Board for Light-Emitting Element

Figure 1:
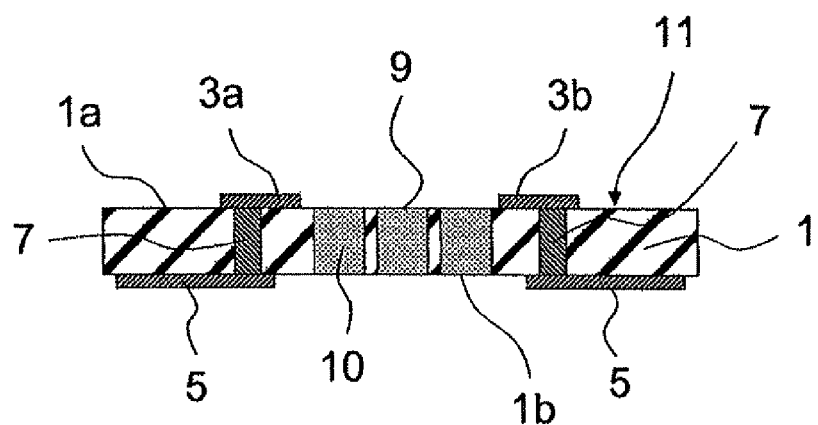
FIGS. 1(a) and 1(b) are sectional views illustrating a representative structure of a wiring board for light-emitting element according to the present invention.
Figure 1:
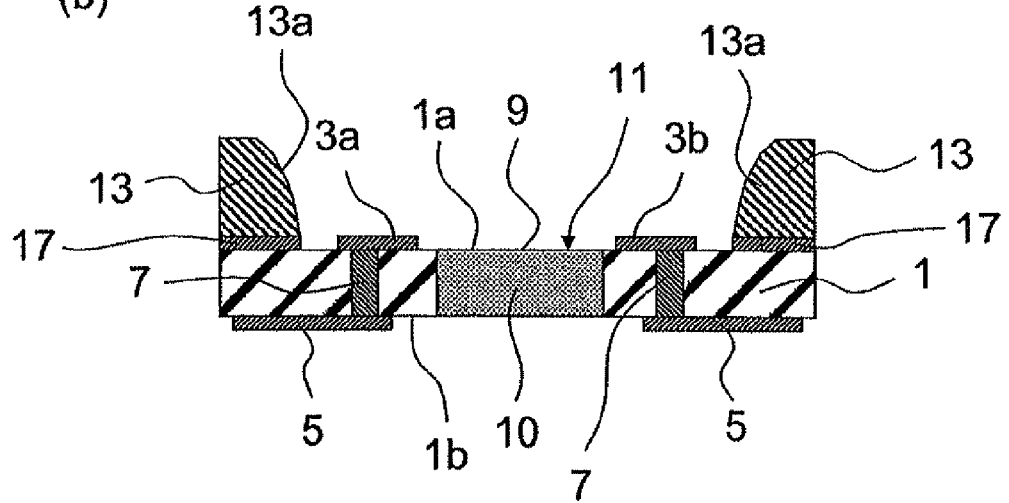

In FIGS. 1(a) and 1(b) illustrating a representative structure of a wiring board for light-emitting element of the present invention, the wiring board generally designated at 11 includes a ceramic insulating substrate 1, conductor layers (connection terminals) 3a and 3b formed on one surface 1a of the insulating board 1, conductor layers (external electrode terminals) 5 formed on the other surface 1b of the insulating substrate 1, and via-conductors 7 formed through the insulating substrate 1 so as to electrically connect the conductor layers 3a, 3b to the conductor layers 5.

On the surface 1a of the insulating substrate 1, there is formed a mounting region 9 between one conductor layer 3a and another conductor layer 3b for mounting a light-emitting element that will be described later. That is, the conductor layers 3a and 3b are electrically connected to the light-emitting element (not shown in FIGS. 1(a) and 1(b)) mounted on the mounting region 9, and work as connection terminals. Further, the conductor layers 5 are electrically connected to an external circuit board such as a printed board and work as external electrode terminals. As will be described later, therefore, the light-emitting element mounted on the mounting region 9 is electrically connected to the external circuit board through the conductor layers 3a, 3b, via-conductors 7 and conductor layers 5. In the following description, therefore, the conductor layers 3a, 3b are called connection terminals, and the conductor layers 5 are called external electrode terminals.

The above connection terminals 3a, 3b and the external electrode terminals 5 are formed by using various metals, and are, usually, formed by using at least one of W, Mo, Cu or Ag as a chief component. When the connection terminals 3a, 3b and the external electrode terminals 5a are formed by using such a metal material, there is obtained an advantage in that they can be formed by the co-firing with the insulating substrate 1. Besides, the wiring board 11 for light-emitting element can be produced inexpensively and quickly.

In the present invention as illustrated in FIG. 1(b), there can be provided a frame 13 for containing the light-emitting element that is mounted so as to surround the mounting region 9 and the conductor layers 3a, 3b. The frame 13 protects the light-emitting element mounted on the mounting region 9, and makes it possible to easily arrange a fluorescent body or the like surrounding the light-emitting element. It is further allowed to reflect light of the light-emitting element by the frame 13 to guide it in a predetermined direction. It is desired that the total reflection factor of the inner wall of the frame 13 is not smaller than 70%, particularly, not smaller than 80% and, most preferably, 85% from the standpoint of suppressing the transmission or absorption of light from the light-emitting element and maintaining a high brightness.

Heat-Conducting Pole-Like Conductor 10

In the present invention, it is important that the mounting region 9 is provided with the heat-conducting pole-like conductor 10 which is extending through the insulating substrate 1. The heat-conducting pole-like conductor 10 is formed by using a material having a thermal conductivity higher than that of the ceramics forming the insulating substrate and, concretely, by using a metal such as W, Mo, Cu or Ag (or is often formed by using a composite material of a metal and ceramics as will be described later). As shown in FIGS. 1(a) and 1(b), the heat-conducting pole-like conductor 10 extends from the mounting region 9 up to the surface 1b on the opposite side of the insulating substrate 1 penetrating through the insulating substrate 1 in the direction of thickness thereof. The heat-conducting pole-like conductor 10 is formed by the co-firing with the insulating substrate 1. Namely, in the wiring board of the invention, the pole-like conductor 10 having a thermal conductivity higher than that of the insulating substrate 1 extends from the mounting region 9 through the insulating substrate 1 enabling the heat generated by the light-emitting element to be quickly radiated through the pole-like conductor 10 which serves as a heat conducting passage and, hence, preventing the light-emitting element from being excessively heated and preventing a decrease in the brightness of the light-emitting element.

Referring to FIGS. 1(a) and 1(b), the pole-like conductor 10 is of the form of a block having a diameter of as large as 500 μm or greater, and is disposed in a number of one or in a plural number in a manner that the upper end surfaces thereof are positioned on the mounting region 9. The pole-like conductor 10 may have any one of a circular shape, an elliptic shape, a square shape or a polygonal shape in plane cross section.

The pole-like conductor 10 of the shape of a block of a large diameter is formed by pushing and fitting a conductor sheet prepared by using a conducting slurry for forming the pole-like conductor 10 into the ceramic green sheet in a manner to penetrate through the ceramic green sheet, and by co-firing the thus prepared composite molded article (this method will be described later in detail). The pole-like conductor 10 of the form of a block has a size like that of, for example, the light-emitting element that is to be mounted, i.e., has a diameter in excess of, for example, 1000 μm, and is capable of realizing a very high heat-radiating performance as compared to that of the one which is a so-called thermal via. To obtain a high heat-radiating performance, in particular, it is desired that the plane sectional area of the pole-like conductor 10 of the form of a block (area of the end surface on the side of the mounting region 9) is greater than the mounting area (corresponds to the bottom surface area) for mounting the light-emitting element on the wiring board 11 and is, for example, not smaller than 1.1 times as great and, most preferably, not smaller than 1.2 times as great as the mounting area for mounting the light-emitting element. An increase in the plane sectional area of the pole-like conductor of the form of a block is accompanied by an increase in the heat-radiating portion making it possible to more quickly radiate the heat generated by the light-emitting element.

The pole-like conductor 10 illustrated in FIGS. 1(a) and 1(b) has electric conductivity and can be incorporated in a portion of the electric circuit. For example, upon directly and electrically connecting the light-emitting element that is mounted and the pole-like conductor 10 together, the connection terminals 3a, 3b and the via-conductors 7 are no longer required, and the wiring board 11 for light-emitting element can be realized in a small size. When the heat-conducting pole-like conductor 10 is provided independently of the electric circuit, there is no electric connection between the heat-conducting pole-like conductor 10 and the external circuit board such as a printed board, and the mounting reliability is improved.

In the present invention, the above-mentioned pole-like conductor 10 has a thermal conductivity higher than that of the insulating substrate and, particularly, has a thermal conductivity of not smaller than 80 W/m·K, preferably, not smaller than 100 W/m·K, more preferably, not smaller than 120 W/m·K, and, most preferably, not smaller than 160 W/m·K. Upon providing the pole-like conductor 10 having a high thermal conductivity, the heat generated by the light-emitting element can be directly and quickly radiated making it possible to maintain stable the emission of light from the light-emitting element, which is desirable from the standpoint of preventing a decrease in the brightness of the light-emitting element. The thermal conductivity of the pole-like conductor 10 can be controlled by suitably selecting the kind of the metal forming it. For example, the pole-like conductor 10 formed by using Cu or Cu—W having a high thermal conductivity exhibits an increased thermal conductivity. To maintain a high thermal conductivity as described above, it is desired that the Cu content in the pole-like conductor 10 is not smaller than 40% by volume, particularly, not smaller than 50% by volume and, more particularly, not smaller than 60% by volume.

In order to improve the reliability of adhesion between the pole-like conductor 10 and the insulating substrate 1, further, it is desired that the coefficient of thermal expansion (40 to 400° C.) of the pole-like conductor 10 is brought close to the coefficient of thermal expansion of the insulating substrate 1. For example, it is desired that the coefficient of thermal expansion of the pole-like conductor 10 is so adjusted that a difference $\Delta\alpha$ in the coefficient of thermal expansion between the insulating substrate 1 and the pole-like conductor 10 is not larger than $4.0\times10^{-6}/°$ C., preferably, not larger than $2.0\times10^{-6}/°$ C. and, most preferably, not larger than $1.0\times10^{-6}/°$ C. This is because the highly reliable wiring board 11 for light-emitting element is obtained upon preventing the mismatching in the thermal expansion between the two. The coefficient of thermal expansion of the pole-like conductor 10 can be adjusted by suitably selecting the kind of the metal. By using, for example, Cu having a high thermal conductivity in combination with W having a coefficient of thermal expansion which is relatively small among the metals, it is allowed to form the pole-like conductor 10 having a high thermal conductivity and exhibiting a suppressed difference in the coefficient of thermal expansion from the insulating substrate 1. Upon forming the pole-like conductor 10 by using a composite material of a metal and ceramics, further, it is allowed to adjust the difference in the coefficient of thermal expansion between the two.

In the present invention, the above-mentioned pole-like conductor 10 is prepared by mixing a predetermined metal powder (e.g., powder of Cu or W described above) with suitable amounts of an organic binder and an organic solvent. So far as a thermal conductivity higher than that of the insulating substrate 1 is maintained, a mixed powder of the metal powder and the ceramics powder (e.g., powder of ceramics for forming the insulating substrate 1) may be prepared being mixed with the organic binder and the organic solvent. So far as the conducting paste of the above mixed powder is used, a high adhering strength is accomplished between the pole-like conductor 10 and the insulating substrate 1 through the co-firing with the ceramic green sheet, and the pole-like conductor 10 is formed by using a composite material of a metal and ceramics. In this case, further, the mixing ratio of the metal powder and the ceramic powder is adjusted to easily control the coefficient of thermal expansion, to bring the coefficient of thermal expansion of the pole-like conductor 10 close to that of the insulating substrate 1, and to suppress the occurrence of cracks caused by mismatching in the thermal expansion between the insulating substrate and the pole-like conductor 10. It is desired that the content of the ceramic powder (corresponds to the content of ceramics in the pole-like conductor 10) in the mixed powder is, usually, not larger than 5% by volume, particularly, not larger than 4% by volume and, most desirably, not larger than 3% by volume to maintain a high thermal conductivity. As the ceramics, it is most desired to use those ceramics that have been used for forming the insulating substrate 1, as a matter of course.

Figure 2:
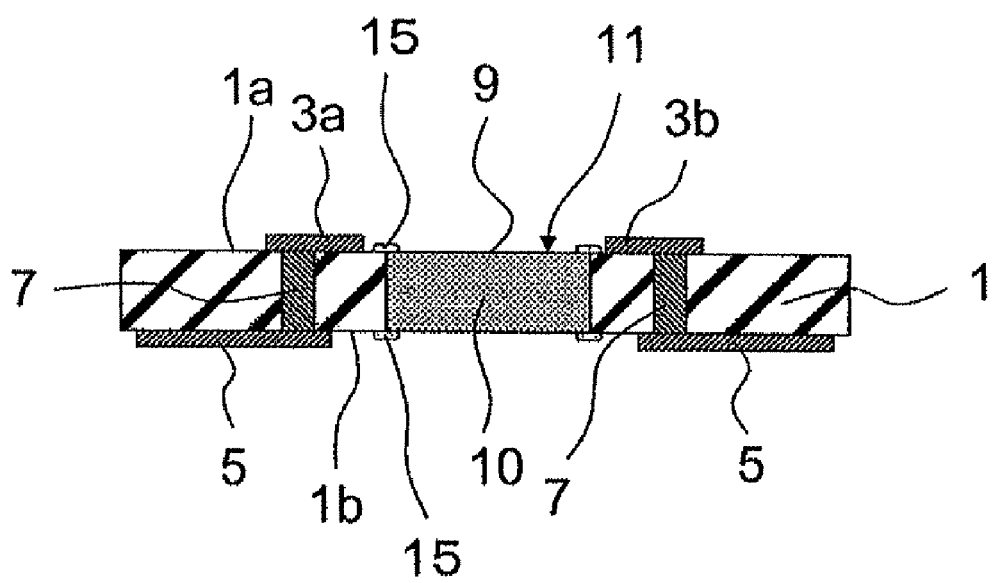
FIG. 2 is a sectional view illustrating another wiring board for light-emitting element according to the present invention.

In the present invention as shown in FIG. 2, further, there can be provided boundary protection layers 15 covering the boundary portions between the end surfaces of the pole-like conductor 10 and the insulating substrate 1 and covering the vicinities thereof. The boundary protection layers 15 are formed by using at least one of a metal, ceramics or a resin. Provision of the boundary protection layers 15 relaxes the difference in the thermal expansion between the pole-like conductor 10 and the insulating substrate 1, and suppresses the occurrence of cracks in the boundary.

The composition of the boundary protection layer 15 can be suitably varied by taking into consideration the difference in the thermal expansion between the pole-like conductor 10 and the insulating substrate 1. By using, for example, a metal or ceramics, the boundary protection layer 15 can be formed by the co-firing with the insulating substrate 1 and the pole-like conductor 10. It is desired that the above ceramics have the same composition as the ceramics used for forming the insulating substrate 1 from the standpoint of sintering property and adhesiveness between the boundary protection layer 15 and the insulating substrate 1. As the above metal, there can be used the one having the same composition as that of the pole-like conductor 10 to improve the sintering property and the adhesiveness between the boundary protection layer 15 and the pole-like conductor 10. From the standpoint of maintaining reliability to the heat cycle, however, it is desired to use a metal having a coefficient of thermal expansion smaller than that of the insulating substrate 1. When, for example, the insulating substrate 1 is made of alumina, it is desired that Cu—W or Mo is used as a metal for forming the boundary protection layer. When the boundary protection layer 15 is used by using a metal, further, it is desired to use ceramics in combination since it makes it possible to control the behavior of sintering and the coefficient of thermal expansion.

When a resin is used as the boundary protection layer 15, the insulating substrate 1 and the pole-like conductor 10 are formed by co-firing. Thereafter, the resin is so printed as to cover the boundary between the insulating substrate 1 and the pole-like conductor 10 followed by curing thereby to form the boundary protection layer 15. When the resin is used as the boundary protection layer 15, there is contained a ceramic powder in an amount of 10 to 50% by volume in addition to the resin component to improve the water resistance and heat-radiating performance of the boundary protection layer 15.

The above boundary protection layer 15 may have a laminated-layer structure consisting of layers of different materials. When, for example, the surface protection layer 15 is formed by laminating a resin layer on the layer formed by using metals and ceramics, cracks that happen to occur on the boundary between the insulating substrate 1 and the pole-like conductor 10 are prevented from developing into the surface layer. Therefore, the above laminated-layer structure is most desired.

Reference should further be made to FIGS. 3(a) and 3(b) illustrating another embodiment of the wiring board 11 for light-emitting element of the present invention.

In the present invention as shown in, for example, FIG. 3(a), a covering layer 16a can be so formed as to completely cover the end surface of the heat-conducting pole-like conductor 10 of the side on where the mounting region 9 is formed and the peripheral edge thereof. The covering layer 16a formed on the end surface of the upper side contains a resin or a metal. Formation of the covering layer 16a, too, relaxes the difference in the thermal expansion between the pole-like conductor 10 and the insulating substrate 1, and suppresses the occurrence of cracks on the boundary between the end surface of the pole-like conductor 10 and the insulating substrate 1. The covering layer 16a, further, works to fix a light-emitting element 21 that will be described later to the mounting region 9. In particular, the covering layer 16*a* formed by using a metal exhibits a thermal conductivity higher than that of the insulating substrate 1 making it possible to quickly release the heat from the light-emitting element 21. Further, the covering layer 16*a* formed by using a resin prevents the short-circuit between the pole-like conductor 10 and the connection terminals 3*a*, 3*b*

Figure 3:
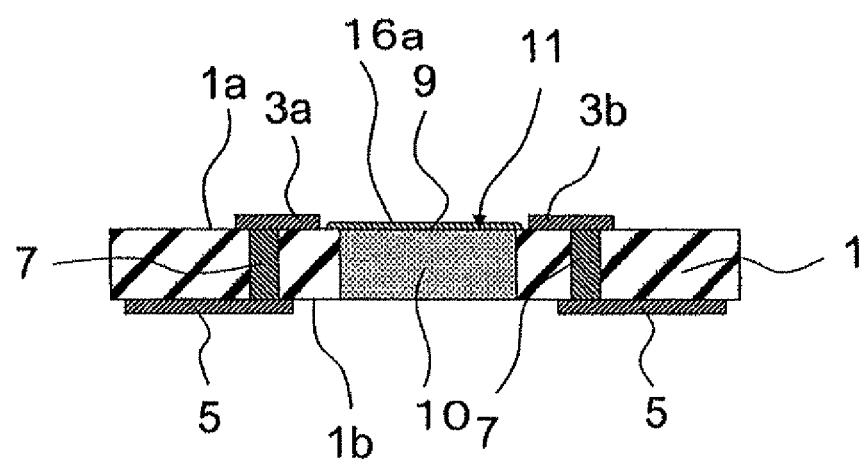
FIGS. 3(a) and 3(b) are sectional views illustrating a further wiring board for light-emitting element according to the present invention.
Figure 3:
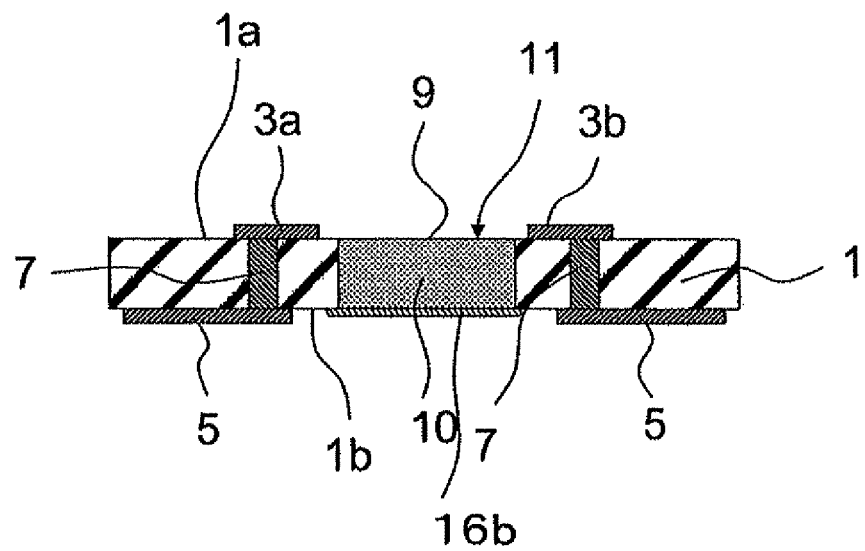

Referring to FIG. 3(*b*), further, it is also allowable to so form a covering layer 16*b* as to completely cover the end surface of the pole-like conductor 10 positioned on the side opposite to the side on where the mounting region 9 is formed and the peripheral edge thereof. The covering layer 16*b* formed on the end surface of the lower side contains at least one of those selected from the group consisting of a metal, ceramics and a resin. Formation of the covering layer 16*b*, too, relaxes the difference in the thermal expansion between the pole-like conductor 10 and the insulating substrate 1, and suppresses the occurrence of cracks on the boundary between the end surface of the pole-like conductor 10 and the insulating substrate 1. Further, the covering layer 16*b* formed by using a metal exhibits a thermal conductivity higher than that of the insulating substrate 1 making it possible to quickly release the heat from the light-emitting element 21. Further, the covering layer 16*b* formed by using ceramics or a resin prevents the short-circuit between the pole-like conductor 10 and the external terminals 5. When ceramics is used, in particular, the covering layer 16*b* can be formed by co-firing with the insulating substrate 1 and the pole-like conductor 10, offering advantage from the standpoint of production.

When the covering layer 16*a* is formed on the upper surface by using a resin and a covering layer 16*b* is formed on the lower surface by using ceramics or a resin as will be understood from the above description, a wiring can be arranged just under the pole-like conductor 10 at the time of mounting, on a printed board, a light-emitting device which is obtained by mounting the light-emitting element 21 on the wiring board 11, offering an advantage from the standpoint of realizing the devices in small sizes.

The above covering layers 16*a* and 16*b* can be easily formed by applying a paste containing a metal or ceramics or by applying a coating solution containing a resin onto the above portions followed by firing or baking. Further, the metal or ceramics used for forming the covering layers 16*a*, 16*b* may be the same as the one used for forming the boundary protection layer 15 described above.

In the present invention, further, the side surface of the pole-like conductor 10 may be tilted or a step may be formed in the side surface to enhance the junction strength between the pole-like conductor 10 (in particular, the pole-like conductor 10 of the form of a block having a large diameter) and the insulating substrate 1, so that the pole-like conductor 10 is firmly incorporated in the insulating substrate 1.

Figure 4:
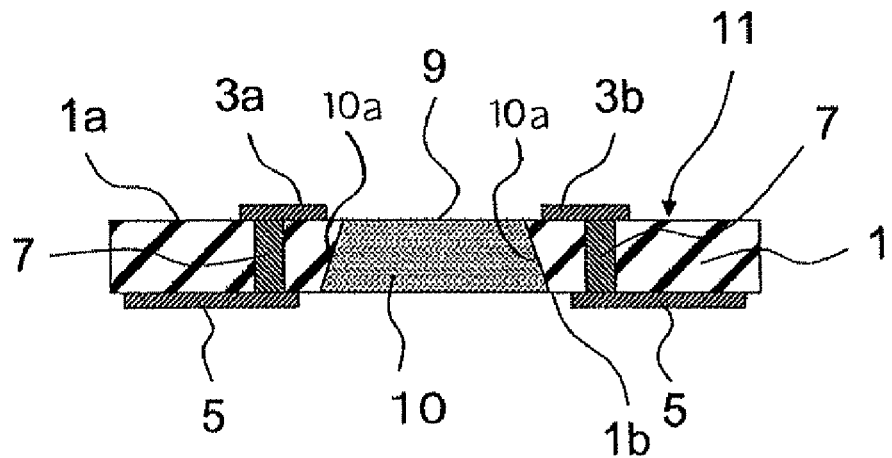
FIGS. 4 (a), (b) and (c) is a view illustrating preferred examples of the shape of the side surface of a heat-conducting pole-like conductor formed on the wiring board for light-emitting element according to the present invention.
Figure 4:
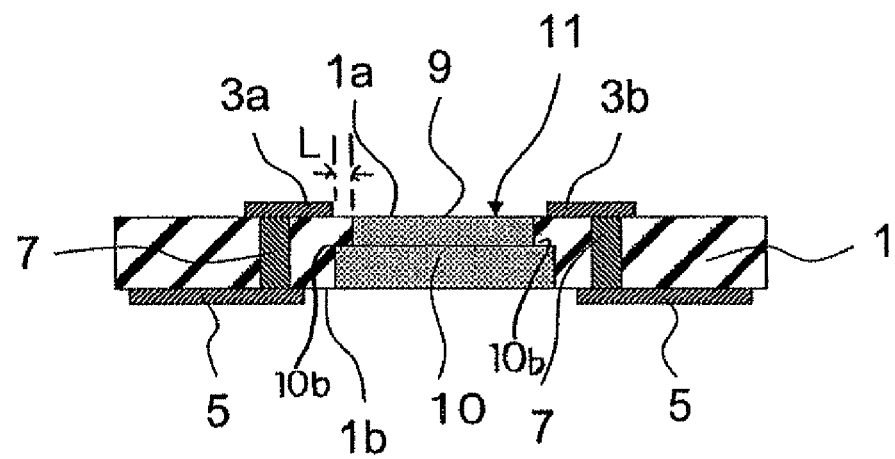
Figure 4:
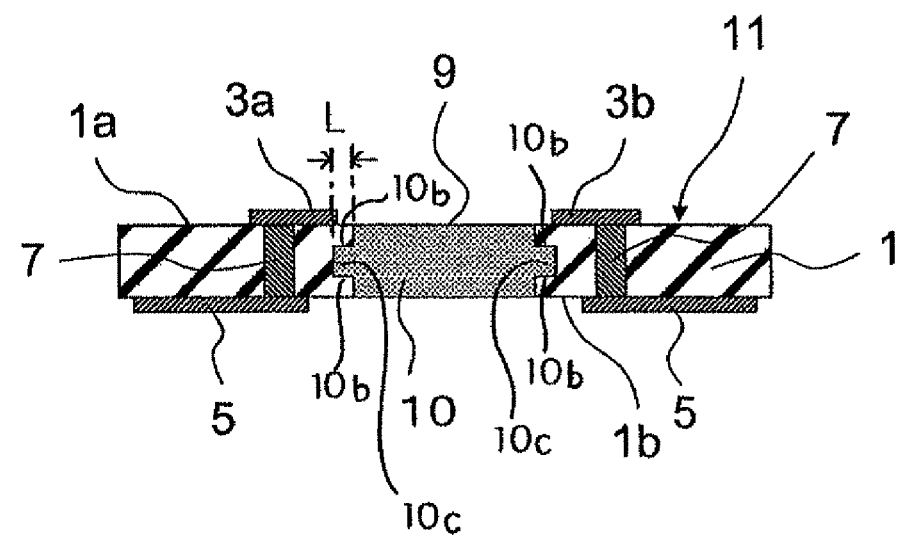

As shown in FIG. 4(*a*), for example, the side surface of the pole-like conductor 10 is tilted as designated at 10*a* to increase the contact area between the pole-like conductor 10 and the insulating substrate 1 thereby to increase the junction strength between the insulating substrate 1 and the pole-like conductor 10. In the illustrated embodiment, the end surface of the pole-like conductor 10 on the side of the mounting region 9 is smaller than the other end surface, so that the side surface thereof is tilted. It is, however, also allowable to form the end surface of the pole-like conductor 10 on the side of the mounting region 9 to be greater than the other end surface, thereby to form a tilted surface. From the standpoint of heat-radiating performance, however, it is desired that the end surface of the pole-like conductor 10 on the side of the mounting region 9 is smaller than the other end surface.

Referring to FIG. 4(*b*), further, a step 10*b* may be formed on the side surface of the pole-like conductor 10. In this case, too, the contact area between the pole-like conductor 10 and the insulating substrate 1 is greater than that of when the side surface of the pole-like conductor 10 is straight, enhancing the junction strength between the insulating substrate 1 and the pole-like conductor 10. In this illustrated embodiment, further, the end surface of the pole-like conductor 10 on the side of the mounting region 9 is smaller than the other end surface. Contrary to this, however, a step may be so formed that the end surface of the pole-like conductor 10 on the side of the mounting region 9 is greater than the other end surface. From the standpoint of heat-radiating performance, however, it is desired that the step 10*b* is so formed that the end surface of the pole-like conductor 10 on the side of the mounting region 9 is smaller than the other end surface.

In the embodiment of FIG. 4(*b*), further, only one step 10*b* is formed on the side surface of the pole-like conductor 10. As shown in FIG. 4(*c*), however, a plurality of steps 10*b* may be formed. That is, in FIG. 4(*c*), there are formed two steps 10*b* on the side surface of the pole-like conductor 10 so that a protruded portion 10*c* is formed on the side surface of the pole-like conductor 10. This increases the contact area between the pole-like conductor 10 and the insulating substrate 1 and, further, enables the side surface of the pole-like conductor 10 to become in firm mesh with the insulating substrate 1. In this embodiment, the junction strength between the two is very enhanced. In FIG. 4(*c*), the protruded portion 10*c* is formed on the side surface due to two steps 10*b*. It is also possible to form a recessed portion in the side surface relying on the two steps 10*b*, as a matter of course. From the standpoint of heat-radiating performance, however, it is desired to form the protruded portion 10*c*.

In the above embodiment of FIGS. 4(*b*) and 4(*c*), it is desired that the length L of the step 10*b* is, usually, not smaller than 100 μm and, particularly, not smaller than 200 μm from the standpoint of increasing the junction strength.

In the embodiment of FIGS. 4(*a*) to 4(*c*), it is desired that the plane sectional area of the pole-like conductor 10 (particularly, the area of the end surface on the side of the mounting region 9) is greater than the mounting area for mounting the light-emitting element from the standpoint of maintaining a high heat-radiating performance.

Figure 5:
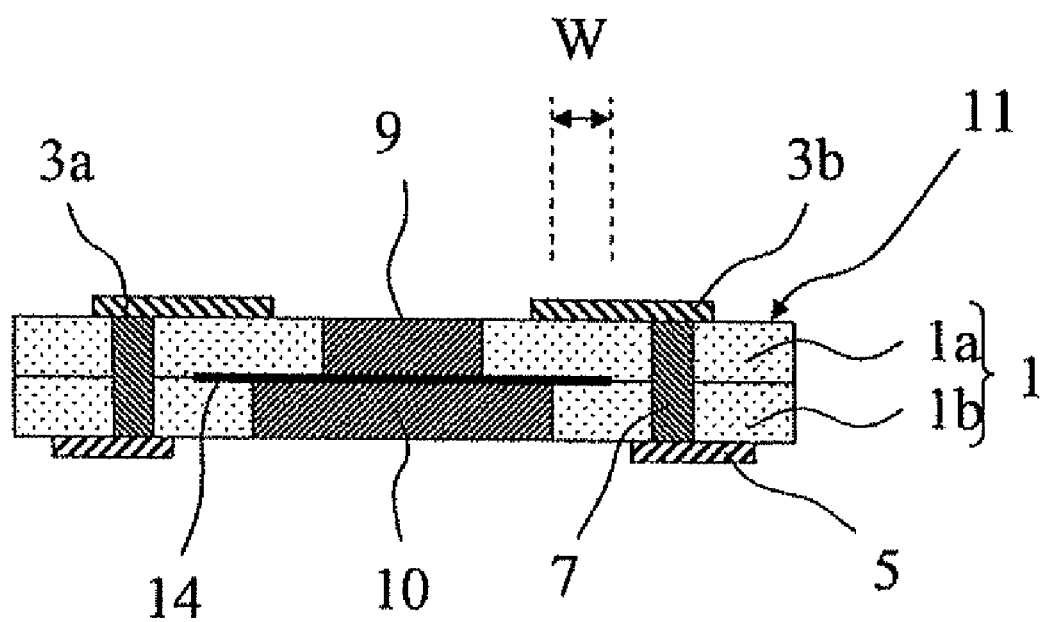
FIG. 5 is a view illustrating a conductor layer that is provided when there is formed a step in the side surface of the heat-conducting pole-like conductor.

When the steps 10*b* are formed on the side surface of the pole-like conductor 10 as shown in FIGS. 4(*b*) and 4(*c*), further, it is desired that a conducting layer 14 is drawn from the step 10*b* as shown in FIG. 5. That is, when the step 10*b* is formed on the side surface of the pole-like conductor 10, stress generates due to a difference in the thermal expansion between the insulating substrate 1 and the pole-like conductor 10 and concentrates near the step 10*b*. As a result, when the light-emitting element that is mounted is repetitively operated, cracks tend to occur near the step 10*b* due to heat generated by the emission of light. On the other hand, formation of the conductor layer 14 relaxes the concentration of stress in the portion near the step 10*b* and effectively suppresses the generation of cracks. The conducting layer 14 is formed by using the same material as the one used for the pole-like conductor 10 offering an advantage of further improving the heat-radiating performance.

In FIG. 5, further, when the step 10*b* is formed on the side surface of the pole-like conductor 10, the insulating substrate 1, usually, assumes a laminated-layer structure of a lamination of a plurality of insulating layers (a two-layer structure of insulating layers 1*a* and 1*b* in FIG. 5), and the step 10*b* is formed on the interface of lamination of the insulating layers 1*a* and 1*b* (refer to a method of forming the pole-like conductor 10 described later). Therefore, the conducting layer 14 extends from the edge of the step 10b along the interface of lamination of the insulating layers 1a, 1b. In this case, it is desired that the length w of protrusion from the edge of the step 10b of the conducting layer 14 is not smaller than 50 μm, particularly, is not smaller than 200 μm and, most desirably, is not smaller than 400 μm to relax the stress to a sufficient degree. Further, the conducting layer 14 is formed by using the same material as the one forming the pole-like conductor 10 and may, hence, extend through the pole-like conductor 10 traversing the pole-like conductor 10 as shown in FIG. 5.

FIG. 5 illustrates the formation of the conducting layer 14 in a case where a single step 10b is formed on the side surface of the pole-like conductor 10. When a plurality of steps 10b are formed as shown in FIG. 4(c), however, it is desired that the conducting layers 14 are drawn from the plurality of steps 10b.

Production of the Insulating Substrate 1 and the Wiring Substrate 11

It was described already that the insulating substrate 1 in the present invention is made of ceramics. It is desired that the insulating substrate 1 has a thermal conductivity of not smaller than 30 W/m·K, preferably, not smaller than 35 W/m·K, more preferably, not smaller than 40 W/m·K and, most preferably, not smaller than 45 W/m·K. The higher the thermal conductivity, the larger the heat-radiating performance from the insulating substrate 1 and the greater the effect for suppressing a decrease of brightness of the light-emitting element. By using, for example, highly pure alumina having a purity of not smaller than 99% as ceramic materials, there, can be produced an insulating substrate having a thermal conductivity of not smaller than 30 W/m·K. By using MgO, further, there can be produced an insulating substrate 1 having a thermal conductivity of not smaller than 40 W/m·K.

It is further desired that the coefficient of thermal expansion of the insulating substrate 1 (room temperature to 400° C.) is not smaller than $8.5 \times 10^{-6}$/° C., preferably, not smaller than $9.0 \times 10^{-6}$/° C. and, most preferably, not smaller than $10.0 \times 10^{-6}$/° C. That is, the difference in the thermal expansion between the insulating substrate 1 and the pole-like conductor 10 or the printed board mounted on the outer side can be decreased by increasing the coefficient of thermal expansion of the ceramic insulating substrate 1, and the connection reliability can be strikingly improved between the insulating substrate 1 and the pole-like conductor 10 or the printed board. It is further allowed to improve the reliability of connection to the resin used for sealing the light-emitting element that is mounted. For example, use of forsterite as the ceramic material makes it possible to produce the insulating substrate 1 having a coefficient of thermal expansion of not smaller than $8.5 \times 10^{-6}$/° C. and use of MgO makes it possible to obtain the insulating substrate 1 having a coefficient of thermal expansion of not smaller than $10.0 \times 10^{-6}$/° C.

It is further desired that the insulating substrate 1 has a total reflection factor of not smaller than 70%, preferably, not smaller than 72%, more preferably, not smaller than 80% and, most preferably, not smaller than 83%. Upon increasing the reflection factor, it is made possible to suppress the light of the light-emitting element from transmitting through the insulating substrate 1, to suppress the emitted light from being absorbed by the insulating substrate 1, and to obtain the wiring board 11 for light-emitting element that has a good light-emitting efficiency. The insulating substrate 1 having a reflection factor of as high as 83% or more can be produced by, for example, using highly pure alumina having a purity of not lower than 99% or by using MgO to which $Y_2O_3$ is added as a sintering assistant.

It is further desired that the three-point flexural strength of the insulating substrate 1 is not smaller than 350 MPa, particularly, not smaller than 400 MPa and, most preferably, not smaller than 450 MPa. The highly strong insulating substrate 1 is not cracked by stress at the time when the light-emitting device mounting the light-emitting element on the wiring board 11, is mounted on an external circuit board such as a printed board. The highly strong insulating substrate 1 can be obtained by using alumina or MgO as the ceramic material.

As will be understood from the foregoing description, the ceramic material used for forming the insulating substrate 1 should be selected by taking into consideration the above-mentioned thermal conductivity, coefficient of thermal expansion and other properties. For example, the insulating substrate 1 made of MgO comprises a sintered body of MgO containing MgO as a main crystal phase, exhibiting a coefficient of thermal expansion (room temperature to 400° C.) of as high as about $10 \times 10^{-6}$/° C., enhancing reliability of mounting on a general-purpose printed board (coefficient of thermal expansion of not smaller than $10 \times 10^{-6}$/° C. or higher), exhibiting a thermal conductivity of not smaller than 30 W/m·K as well as further increased total reflection factor and three-point flexural strength.

The sintered body of MgO containing MgO as a main crystal phase is the one of which the peak of MgO can be detected as a main peak by, for example, the X-ray diffraction and which contains MgO crystals in an amount of not less than 50% by volume as a volume ratio.

The insulating substrate 1 of MgO is obtained by firing a ceramic green sheet at a temperature of higher than 1050° C. and, particularly, in a temperature range of 1300 to 1700° C., the ceramic green sheet being obtained by molding a mixed powder of an MgO powder having an average particle size in a range of 0.1 to 8 μm and a purity of not lower than 99% and at least one kind of a sintering assistant selected from the group consisting of a rare earth oxide (e.g., $Y_2O_3$, $M_2O_3$, etc.), $Al_2O_3$, $SiO_2$, CaO, SrO, BaO, $B_2O_3$ and $ZrO_2$ or a filler powder (average particle size of 0.1 to 8 μm). To the above mixed powder, further, there may be added $MgAl_2O_4$ containing MgO or an $MgO \cdot SiO_2$ composite oxide.

It is desired that the additive such as the sintering assistant is used for obtaining a densely sintered body with MgO as a main crystal, being added in an amount of not less than 3% by mass and, particularly, not less than 5% by mass to lower the firing temperature. From the standpoint of precipitating the MgO crystals in large amounts, further, it is desired that the above additive is added to the mixed powder in an amount of not lager than 30% by mass and, particularly, not larger than 20% by mass. When the amount of the additive is not larger than 10% by mass, in particular, most of the insulating substrate 1 that is obtained is formed by the MgO crystals.

The insulating substrate 1 made of the alumina comprises a sintered body of $Al_2O_3$ containing $Al_2O_3$ as a main crystal phase, exhibits properties as described above and further offers an advantage of low cost. The sintered body of $Al_2O_3$ containing $Al_2O_3$ as a main crystal phase is the one of which the peak of $Al_2O_3$ can be detected as a main peak by, for example, the X-ray diffraction and which contains $Al_2O_3$ crystals in an amount of not less than 50% by volume.

The insulating substrate 1 of alumina is obtained by firing a ceramic green sheet at a temperature of not higher than 1050° C. and, particularly, in a temperature range of 1300 to 1500° C., the ceramic green sheet being obtained by molding a mixed powder of an $Al_2O_3$ powder having an average particle size of 1.0 to 2.0 µm and a purity of not lower than 99% to which is added at least one kind of a sintering assistant powder (average particle size of 1.0 to 2.0 µm) selected from the group consisting of $Mn_2O_3$, $SiO_2$, MgO, SrO, and CaO.

In producing the alumina insulating substrate 1 in a manner as described above, it is desired that the additive such as the sintering assistant is added to the mixed powder for molding the ceramic green sheet in an amount of not less than 5% by mass and, particularly, not less than 7% by mass to lower the firing temperature. From the standpoint of obtaining a densely sintered body containing $Al_2O_3$ as main crystals, further, it is desired that the above additive is added to the mixed powder in an amount of not lager than 15% by mass and, particularly, not larger than 10% by mass. In this case, most of the insulating substrate 1 that is obtained comprises $Al_2O_3$ crystals.

In the foregoing were described the MgO insulating substrate 1 and the alumina insulating substrate 1. However, the insulating substrate used in the present invention is not limited thereto only but may further use sintered bodies containing mullite, spinel or forsterite as main crystals of ceramics. It is further allowable to form the insulating substrate 1 using the so-called glass ceramics. The glass ceramic insulating board 1 can be produced by firing at a low temperature of not higher than 1050° C. featuring a dense and smooth surface, particularly, in forming the connection terminals 3a, 3b, external electrode terminals 5 and via-conductors 7 by using a conductor of a low resistance, such as Ag or Cu relying on the co-firing.

The glass ceramic insulating substrate 1 can be produced by firing a ceramic green sheet at a temperature of not higher than 1050° C. and, particularly at a temperature of 850° C. to 1050° C., the ceramic green sheet being obtained by molding, in the same manner as described above, a mixed powder of, for example, a glass powder and a filler powder such as $SiO_2$ powder. To produce the highly strong insulating substrate 1, it is desired that the content of the filler in the mixed powder is, usually, in a range of 30 to 60% by mass and, particularly, 35 to 55% by mass though it may vary depending upon the composition of the glass.

In producing the above various insulating substrates 1, the ceramic green sheet can be molded by a known method by using a mixed powder of starting materials. For instance, a slurry for molding is prepared by adding a binder and a solvent to a mixed powder containing a ceramic material such as MgO or $Al_2O_3$. The slurry is, then, molded into a ceramic green sheet by such means as a doctor blade method.

To produce the wiring board 11, therefore, through holes corresponding to the via-conductors 7 are perforated in the ceramic green sheet at predetermined positions by the laser working, etc., and a conducting paste obtained by dispersing a metal powder in a suitable binder or a solvent is filled in the through holes. Further, the conducting paste is printed on the surface of the ceramic green sheet at predetermined positions in a pattern that corresponds to the connection terminals 3a, 3b and the external electrodes 5. Moreover, the conducting pattern corresponding to the pole-like conductor 10 is incorporated in the ceramic green sheet and is fired (co-fired) in this state, whereby the connection terminals 3a, 3b and the via-conductors 7 are formed on the surface and inside the insulating substrate 1, and there is obtained the wiring board 11 provided with the pole-like conductor 10. The connection terminals 3a, 3b and the external electrode terminals 5 can be directly formed on the surface of the insulating substrate by transferring a metal foil onto the ceramic green sheet or by a thin film-forming method such as vaporization.

The conducting pattern corresponding to the pole-like conductor 10 is incorporated into the ceramic green sheet in a manner as described below.

When the pole-like conductor 10 has a shape as shown in FIG. 1(a), through holes are perforated in the green sheet at predetermined position like the case of forming the via-conductors 7, and the conducting paste containing a metal powder for forming the pole-like conductor 10 is filled in the through holes, so that the conducting pattern for forming the pole-like conductor 10 is incorporated in the ceramic green sheet.

Figure 6:
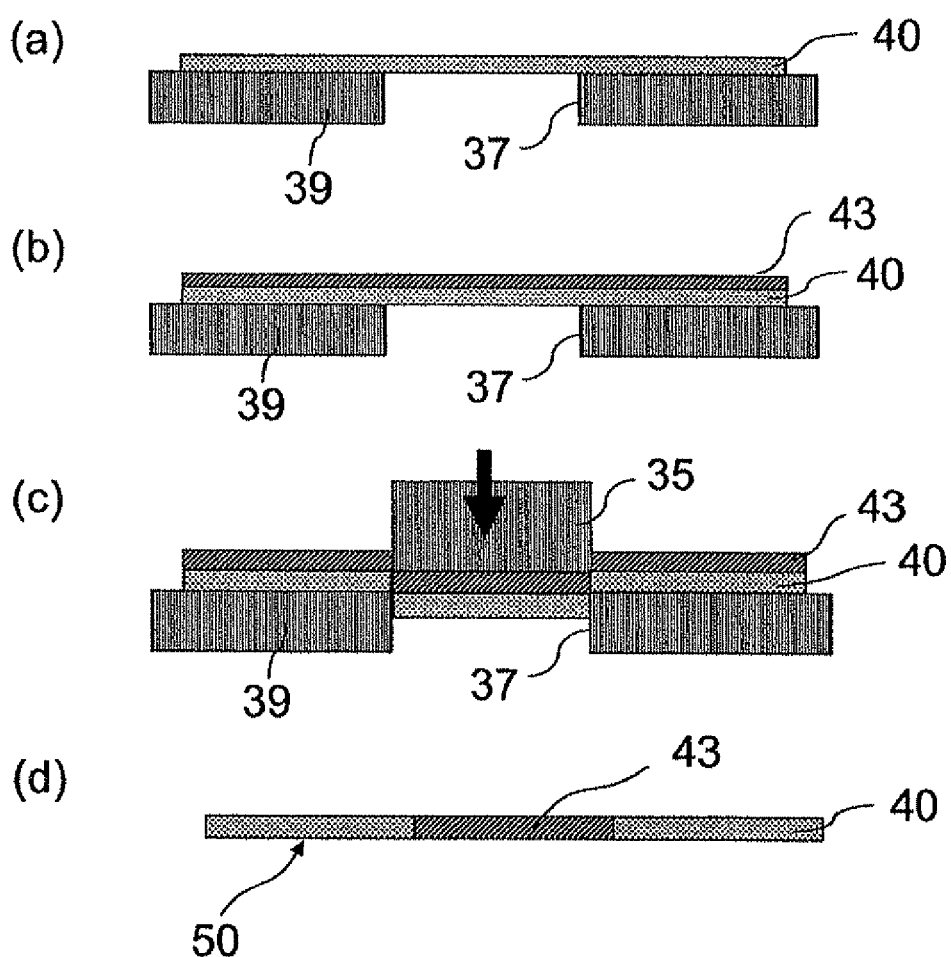
FIGS. 6 (a), (b), (c) and (d) is a view illustrating a method of incorporating a pole-like conductor in an insulating substrate in the wiring board for light-emitting element according to the present invention.

When the pole-like conductor 10 has the shape of a block as shown in FIG. 1(b), the conducting sheet corresponding to the pole-like conductor 10 is pushed into the ceramic green sheet at predetermined positions so as to incorporate the conducting pattern for forming the pole-like conductor 10. FIG. 6 illustrates a method of forming the conducting pattern.

That is, referring to FIG. 6(a), a ceramic green sheet 40 is arranged on the upper surface of a metal mold 39 having a punched hole 37.

Referring, next, to FIG. 6(b), a conducting sheet 43 for forming the pole-like conductor 10 is overlapped on the ceramic green sheet 40. Desirably, the conducting sheet 43 has a thickness nearly comparable to that of the ceramic green sheet 40. The conducting sheet 43 is prepared by molding, relying on a sheet-molding method such as the doctor blade method, a conducting slurry obtained by mixing a metal powder for forming the above pole-like conductor 10 (a mixed powder of the metal powder and the ceramic powder) into an organic binder and a solvent.

Referring, next, to FIG. 6(c), the conducting sheet 43 is pushed into the ceramic green sheet 40 by using a pushing metal mold 35. There is, thus, established a state where part of the conducting sheet 43 is inserted in the ceramic green sheet 43.

Further, the conducting sheet 43 of a portion that has not been pushed into the ceramic green sheet 43 is removed and, at the same time, a portion of the ceramic green sheet 40 pushed by the conducting sheet 43 is removed to form a composite sheet 50 in which part of the conducting sheet 43 is incorporated so as to penetrate through part of the ceramic green sheet 40 as shown in FIG. 6(d). Namely, the conducting sheet 43 fitted into the composite sheet 50 as shown in FIG. 6(d) becomes a conducting pattern corresponding to the pole-like conductor 10. On the above composite sheet (green sheet) 50, there are formed conducting patterns corresponding to the connection terminals 3a, 3b, external terminals 5 and via-conductors 7 as described above. The composite sheet (green sheet) 50 in this state is subjected to the firing.

In order to form the pole-like conductor 10 having a tilted side surface 10a as shown in FIG. 4(a), the punched hole 37 may have a tapered surface that corresponds to the tilted surface 10a.

Figure 7:
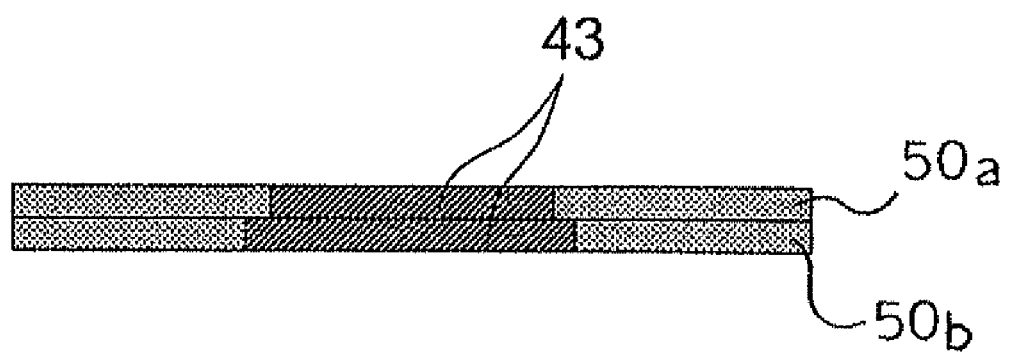
FIG. 7 is a view illustrating another method of incorporating a pole-like conductor in an insulating substrate in the wiring board for light-emitting element according to the present invention.

To form the pole-like conductor 10 having a step 10b formed on the side surface as shown in FIG. 4(b), there are prepared, as shown in FIG. 7, a composite sheet 50a incorporating therein a conducting sheet 43 of a small diameter and a composite sheet 50b incorporating therein a conducting sheet 43 of a large diameter according to the above-mentioned method, and the composite sheets 50a and 50b are press-adhered to prepare a laminate thereof. In this laminate, a step 10b is formed at an end of a portion where the conducting sheet 43 of the small diameter formed in the composite sheet 50a faces the conducting sheet 43 of the large diameter formed in the composite sheet 50b. Upon firing the laminate, therefore, the pole-like conductor 10 of the shape shown in FIG. 4(b) is formed in the insulating substrate 1. In this case, the insulating substrate 1 has a laminated-layer structure of two insulating layers laminated one upon the other. To form the conducting layer 14 shown in FIG. 5, further, the conducting paste may be applied, by screen-printing or the like, onto the interface of lamination of either the composite sheet 50a or the composite sheet 50b as shown in FIG. 5 so as to be corresponded to the conducting layer 14.

To form the pole-like conductor 10 having a plurality of steps 10b formed on the side surface as shown in FIG. 4(c), further, the composite sheet 50b incorporating therein the conducting sheet 43 of a large diameter is held by two pieces of composite sheets 50a (incorporating therein the conducting sheet 43 of a small diameter) to prepare a laminate of a three-layer constitution, which is, then, fired. In this case, the insulating substrate 1 that is fabricated has a laminated-layer structure of three insulating layers.

In the embodiment of FIG. 7, the laminate of the composite sheet 50 is prepared for forming the pole-like conductor 10 having the step 10b. To form the pole-like conductor 10 without step 10b, on the other hand, there is prepared a laminate of the composite sheets 50 which is, then, fired. In this case, the compositions of the conducting sheets 43 in the composite sheets 50 are differed to form the pole-like conductor 10 comprising a plurality of layers having coefficients of thermal expansion and thermal conductivities which are different from each other. For example, there is formed the pole-like conductor 10 by laminating a first composite sheet burying therein a conducting sheet comprising 40% by volume of Cu and 60% by volume of W, and a second composite sheet burying therein a conducting sheet comprising 50% by volume of Cu and 50% by volume of W in a manner that the first composite sheet is on the side of the mounting region 9 and the second composite sheet is on the side opposite to the mounting region 9. In this case, the layer (side of the mounting region 9) stemming from the conducting sheet of the first composite sheet has a low coefficient of thermal expansion creating a small difference in the coefficient of thermal expansion from the light-emitting element that is mounted while the layer (side opposite to the mounting region 9) stemming from the conducting sheet in the second composite sheet has a large thermal conductivity yet exhibiting a large coefficient of thermal expansion. As will be understood from the above, if the layer on the side of the mounting region 9 is the one exhibiting a small coefficient of thermal expansion, the layer having a high thermal conductivity can be arranged on the side opposite to the mounting region 9 without the need of giving attention to the coefficient of thermal expansion making it possible to markedly enhance the heat-radiating performance yet maintaining reliability of connection to the light-emitting element.

Further, a paste containing a metal, such as an Mo paste, is applied by screen-printing or the like method onto the exposed surface of the conducting sheet 43 (corresponds to the end surface of the pole-like conductor 10) in the composite sheet 50 (or in the laminate of the composite sheets 50) and onto the interface between the green sheet 40 and the conducting sheet 43, and is fired to form the covering layers 16a, 16b shown in FIGS. 3(a) and 3(b) on the end surface of the upper side of the pole-like conductor 10 or on the end surface of the lower side thereof. The boundary protection layers 15 shown in FIG. 2 are formed by applying a paste having the same composition as that of the above green sheet 40 onto the predetermined positions of the composite sheet like the above-mentioned metal paste, followed by firing. Further, to form the covering layers 16a, 16b and the boundary protection layers 15 by using a resin, a coating solution containing the resin is applied onto the predetermined positions after the composite sheet has been sintered, and is dried and cured.

The above ceramic green sheet (or composite sheet) is fired by being heated at a predetermined firing temperature in an oxidizing atmosphere, a reducing atmosphere or an inert atmosphere after the binder has been removed. In particular, when a material subject to be oxidized like Cu is used as the metal powder, the firing is conducted in the reducing atmosphere or in the inert atmosphere.

After the firing, as required, Al or Ag is plated on the surfaces of the connection terminals 3a, 3b, external electrode terminals 5 and pole-like conductor 10 to increase the reflection factor of these members and the brightness. In particular, nickel, gold and silver are plated in this order on the metallized surfaces of the connection terminals 3a, 3b, pole-like conductor 10 and inner wall surfaces 13a of the frame to firmly fix a silver-plated layer having a high reflection factor. Upon forming the silver-plated layer on the inner surfaces 13a of the frame, in particular, light from the light-emitting element is reflected by the inner wall surfaces 13a and is emitted to the outer side.

In forming the nickel-plated layer as the underlying layer, if silver is directly plated on the nickel-plated layer, nickel in the nickel-plated layer elutes into the silver-plating bath and deposits on the wiring conductor and on the silver-plated layer on the mounting region, or nickel particles are peeled off the nickel-plated layer due to vibration during the conveyance before the silver-plating treatment and deposits on the wiring conductor and on the mounting region. In this embodiment, however, gold is plated on the nickel-plated layer without arousing the above inconvenience, without hindering the mounting of the light-emitting element and suppressing a drop in the bonding property.

In the present invention, the frame 13 for protecting the light-emitting element that is mounted is formed by using a ceramic material or a metal material. When the ceramics is used, the frame 13 can be formed at one time by co-firing together with the above insulating substrate 1, connection terminals 3a, 3b, external terminals 5 and pole-like conductor 10 offering advantage from the standpoint of productivity. Besides, the ceramic frame 13 features excellent heat resistance and moisture resistance, exhibiting excellent durability even when used for extended periods of time or under severe conditions. On the inner wall surface 13a of the ceramic frame 13, further, a metallized layer (not shown) is formed by co-firing by using the conducting paste used for forming the above connection terminals 3a, 3b to further improve the durability and to increase the reflection factor. On the metallized layer, there can be further formed a plated layer (not shown) of Ni, Au or Ag. Upon forming the metallized layer and the plated layer, the total reflection factor of the inner wall surface 13a of the frame 13 can be adjusted to be not lower than 70%, particularly, not lower than 80% and, most desirably, not lower than 85% to suppress the transmission or absorption of light from the light-emitting element and, hence, to realize a high degree of brightness. Particularly, the inner wall surface 13a of the frame 13 having a reflection factor of as high as 85% or more can be realized by forming a lustrous Ag plating.

Further, the metallic frame 13 has an advantage of having a high reflection factor by itself. As such a metal, it is desired to use Al or an Fe—Ni—Co alloy since it is inexpensive and can be excellently worked. On the inner wall surface 13a of the metallic frame 13, too, there can be plated a layer (not shown) of Ni, Au or Ag like the one described above. The above plated layer further increases the total reflection factor of the inner wall surface 13a; i.e., helps realize the total reflection factor of not lower than, for example, 85%. The metallic frame 13 is formed, for example, by forming a conducting layer 17 in advance on the surface 1a of the insulating substrate 1 obtained through the firing, and brazing the conducting layer 17 and the frame 13 together via a brazing material such as a eutectic Ag—Cu brazing material.

In the embodiment of FIG. 1(b), the inner wall surface 13a of the frame 13 is represented by an erected surface. Not being limited to the erected surface, however, the inner wall surface 13a may be in the shape of a flaring curved surface or a tilted surface of which the diameter is increasing toward the upper side. Forming the inner wall surface 13 in a curved surface or a tilted surface is desirable from the standpoint of guiding light of the light-emitting element toward the outer side.

Light-Emitting Device

The wiring board 11 for light-emitting element of the invention produced as described above can be used as a light-emitting device by mounting the light-emitting element on the mounting region 9 thereof.

Figure 8:
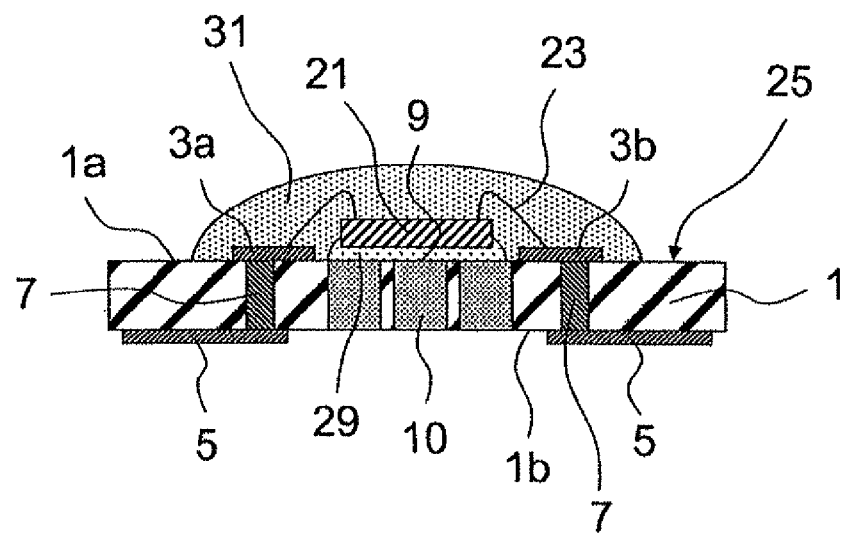
FIGS. 8 (a) and (b) is a view illustrating a sectional structure of a light-emitting element mounting a light-emitting element on the wiring board for light-emitting element of FIG. 1.
Figure 8:
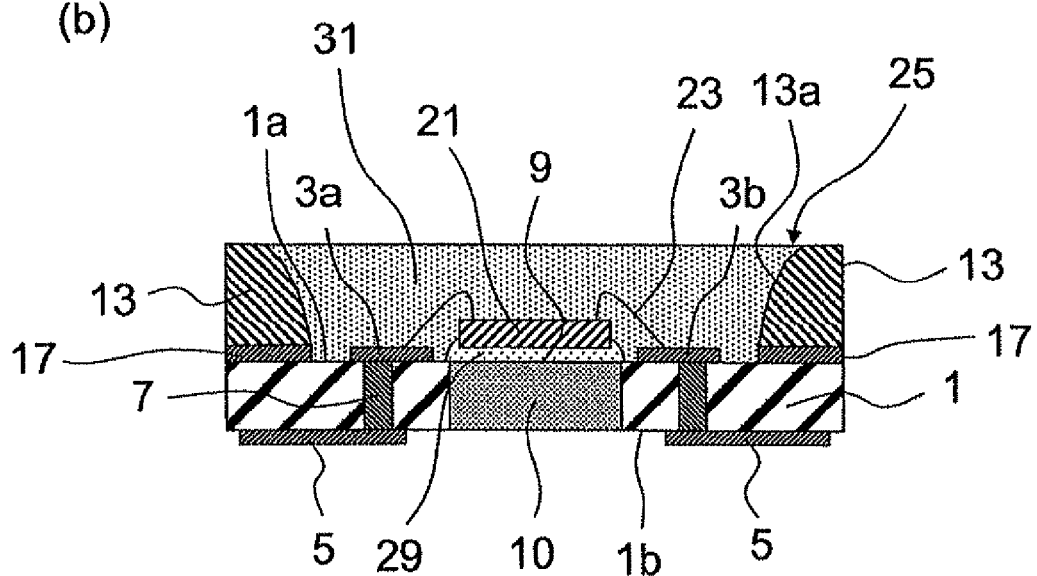

In FIGS. 8(a) and 8(b) which are sectional views illustrating the structure, the light-emitting device generally designated at 25 has a structure in which a light-emitting element 21 such as an LED chip is mounted on the mounting region 9 of the wiring board 11. The light-emitting device 25 illustrated in FIG. 8(a) is the one mounting the light-emitting element 21 on the wiring board 11 of FIG. 1(a), and the light-emitting device 25 illustrated in FIG. 8(b) is the one mounting the light-emitting element 21 on the wiring board 11 of FIG. 1(b).

In this light-emitting device 25, the light-emitting element 21 is adhered and fixed to the mounting region 9 of the wiring board 11 with a suitable adhesive 29 and is connected to the connection terminals 3a, 3b of the wiring board 11 through the bonding wires 23. Namely, the light-emitting element 21 works upon feeding electricity to the light-emitting element 21 from the connection terminals 3a, 3b through the bonding wires 23. Further, the light-emitting element 21 can be connected and fixed to the mounting region 9 by a so-called flip-chip connection without using the adhesive 29. In this case, the electricity can be directly fed to the light-emitting element 21 from, for example, the connection terminals 3a, 3b without using the bonding wires 23.

Further, the light-emitting element 21 mounted on the wiring board 11 is sealed with a molding material 31 of a transparent resin material or the like. However, the light-emitting element 21 can be sealed even by using a closure member of a transparent material (e.g., glass) instead of using the above molding material. A fluorescent material may be added to the molding material 31 to change the wavelength of light emitted by the light-emitting element 21.

In the above light-emitting device 25, heat generated by the light-emitting element 21 is quickly radiated from the heat-conducting pole-like conductor 10 making it possible to effectively avoid a decrease in the brightness caused by heat and, hence, to emit light maintaining stability and high brightness for extended periods of time. Besides, no heat-radiating member such as heat sink is necessary, which is very effective in decreasing the size of the electric device on which the light-emitting device 25 is mounted.

Besides, light emitted from the light-emitting device 25 is reflected by the surface of the insulating substrate 1 and by the inner surfaces of the frame 13 so as to be guided to a predetermined direction, enhancing the light-emitting efficiency.

Moreover, the light-emitting device 25 is, usually, mounted on an external circuit board (not shown) such as a printed board through the external connection terminals 5. Here, the coefficient of thermal expansion of the insulating substrate 1 is brought close to that of the printed board to suppress mismatching in the coefficient of thermal expansion relative to the printed board or the molding material 31, realizing the light-emitting device 25 featuring a highly reliable junction.

The invention claimed is:

1. A light-emitting device, comprising:
a ceramic substrate having a hole therein;
a conducting block:
  filling the hole and adhered to the ceramic substrate;
  having a pole like shape; and
  having a thermal conductivity higher than that of the ceramic substrate;
a first covering layer containing a metal, and covering a first end surface of the conducting block and a peripheral edge around the hole of the ceramic substrate;
a light-emitting element located above the first covering layer and the first end surface, and
a plurality of plated layers on the first covering layer, the plated layers comprising a nickel plated layer and a silver plated layer, wherein the nickel plated layer is located at a first covering layer side and the silver plated layer is located at a light emitting element side,
wherein the conducting block has a plane sectional area greater than that of the light-emitting element.

2. The light-emitting device according to claim 1, wherein a width of the first end surface of the conducting block is wider than a width of the light-emitting element, and is narrower than a width of the first covering layer.

3. The light-emitting device according to claim 1, further comprising a second covering layer covering a second end surface of the conducting block opposite to the first end surface and peripheral edge around the hole of the ceramic substrate.

4. The light-emitting device according to claim 1, wherein the second covering layer contains a metal, ceramics, a resin or a mixture thereof.

5. The light-emitting device according to claim 1, wherein the conducting block is comprises a composite material with a metal material and a ceramic material.

6. The light-emitting device according to claim 1, wherein the conducting block is electrically coupled to a portion of an electric circuit.

7. The light-emitting device according to claim 1, further comprising a frame on the ceramic substrate, surrounding the light-emitting element.

8. The light-emitting device according to claim 7, wherein an inner diameter of the frame at a top end is larger than that at a bottom end, and the frame comprises an inner wall having a curved surface that is swelling toward the light-emitting element.

* * * * *